(12) United States Patent
    Takeuchi

(10) Patent No.: US 12,568,672 B2
(45) Date of Patent: Mar. 3, 2026

(54) SEMICONDUCTOR UNIT, SEMICONDUCTOR MODULE, AND ELECTRONIC APPARATUS

(71) Applicant: SONY SEMICONDUCTOR SOLUTIONS CORPORATION, Kanagawa (JP)

(72) Inventor: Katsuhiko Takeuchi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 552 days.

(21) Appl. No.: 17/999,091

(22) PCT Filed: Mar. 31, 2021

(86) PCT No.: PCT/JP2021/013868
§ 371 (c)(1),
(2) Date: Nov. 17, 2022

(87) PCT Pub. No.: WO2021/240990
PCT Pub. Date: Dec. 2, 2021

(65) Prior Publication Data
US 2023/0178612 A1      Jun. 8, 2023

(30) Foreign Application Priority Data
May 25, 2020      (JP) .................................. 2020-090913

(51) Int. Cl.
H10D 64/27          (2025.01)
H10D 30/01          (2025.01)
          (Continued)

(52) U.S. Cl.
CPC ........... H10D 64/27 (2025.01); H10D 30/015 (2025.01); H10D 30/475 (2025.01);
          (Continued)

(58) Field of Classification Search
CPC .. H10D 30/015; H10D 30/475; H10D 62/126; H10D 30/021; H10D 30/60
See application file for complete search history.

(56) References Cited

U.S. PATENT DOCUMENTS 6,507,051 B1 *   1/2003  Hara .................... H10D 64/411
                                                    438/176
2013/0193487 A1 *  8/2013  Peroni .................. H10D 64/411
                                                    257/194

(Continued)

FOREIGN PATENT DOCUMENTS

JP        2001-060684 A        3/2001
JP        2012231002 A        11/2012

(Continued)

OTHER PUBLICATIONS

International Search Report and Written Opinion of PCT Application No. PCT/JP2021/013868, issued on Jul. 6, 2021, 12 pages of ISRWO.

*Primary Examiner* — Syed I Gheyas
(74) *Attorney, Agent, or Firm* — CHIP LAW GROUP

(57)          ABSTRACT
A semiconductor unit includes: a barrier layer including a first compound semiconductor; a channel layer including a second compound semiconductor, and bonded to the barrier layer at a first face; an insulation layer provided on a second face, of the barrier layer, that is on an opposite side of the first face, and having an opening section that exposes the barrier layer; a gate electrode provided to bury the opening section; a source electrode and a drain electrode that are provided on the second face of the barrier layer on both sides of the gate electrode with the gate electrode being interposed; and a material layer including a metal material or a semiconductor material, and provided in contact with the second face of the barrier layer between the gate electrode and the drain electrode.

12 Claims, 10 Drawing Sheets

(51) Int. Cl.

| | |
|---|---|
| *H10D 30/47* | (2025.01) |
| *H10D 62/10* | (2025.01) |
| *H10D 62/13* | (2025.01) |
| *H10D 62/17* | (2025.01) |
| *H10D 62/85* | (2025.01) |
| *H10D 64/00* | (2025.01) |
| *H10D 64/01* | (2025.01) |
| *H10D 64/23* | (2025.01) |
| *H10D 64/62* | (2025.01) |
| *H01L 23/29* | (2006.01) |
| *H01L 23/31* | (2006.01) |
| *H10D 62/824* | (2025.01) |

(52) U.S. Cl.
CPC ........... *H10D 62/126* (2025.01); *H10D 62/13* (2025.01); *H10D 62/17* (2025.01); *H10D 62/85* (2025.01); *H10D 64/01* (2025.01); *H10D 64/115* (2025.01); *H10D 64/257* (2025.01); *H10D 64/411* (2025.01); *H10D 64/62* (2025.01); *H01L 23/291* (2013.01); *H01L 23/3171* (2013.01); *H10D 62/824* (2025.01); *H10D 62/8503* (2025.01)

(56) References Cited

U.S. PATENT DOCUMENTS

| | | | |
|---|---|---|---|
| 2015/0263152 A1* | 9/2015 | Yasumoto ............ | H10D 64/118 257/194 |
| 2017/0148826 A1* | 5/2017 | Choi ...................... | H10D 86/60 |

FOREIGN PATENT DOCUMENTS

| | | |
|---|---|---|
| JP | 2012-248636 A | 12/2012 |
| JP | 2013098222 A | 5/2013 |
| JP | 2015-115605 A | 6/2015 |
| JP | 2016-136547 A | 7/2016 |
| JP | 2017-130579 A | 7/2017 |
| WO | WO-2016098390 A1 | 6/2016 |
| WO | 2019/208034 A1 | 10/2019 |

* cited by examiner

[FIG. 1]
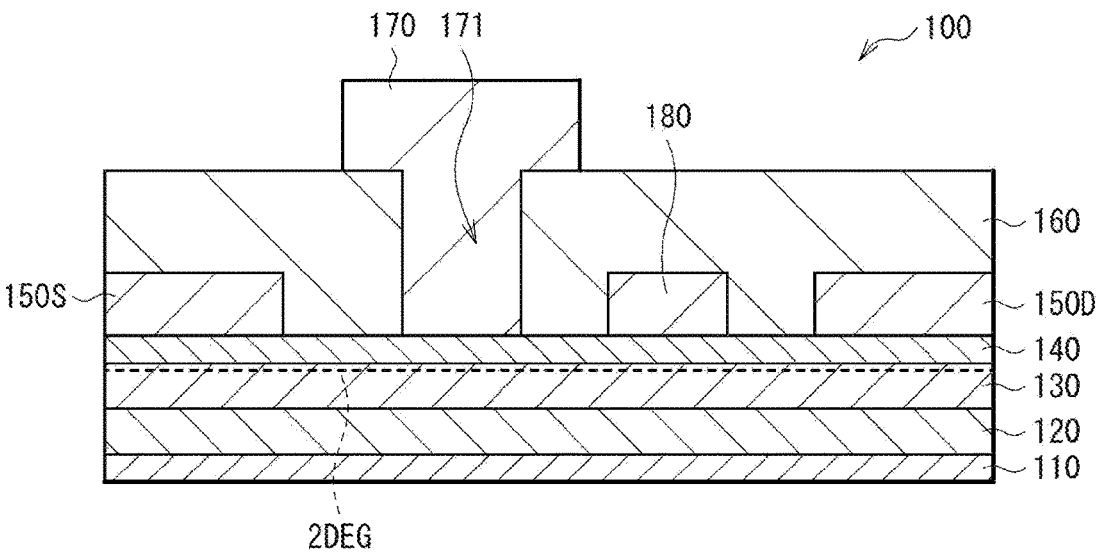
[FIG. 2]
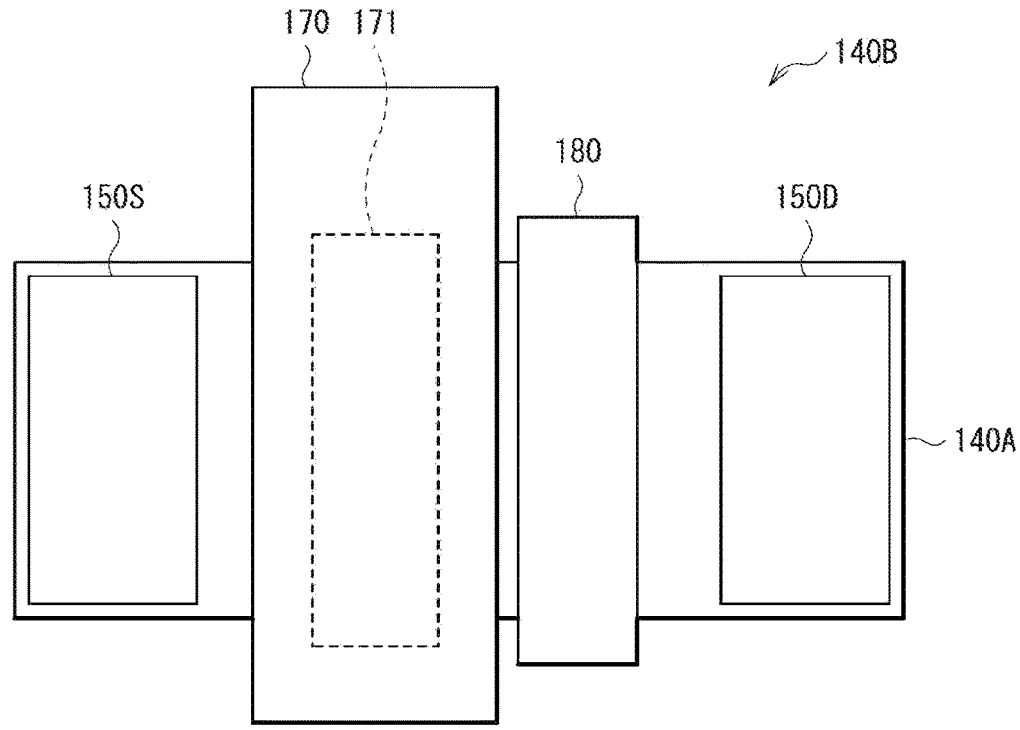

[FIG. 3]
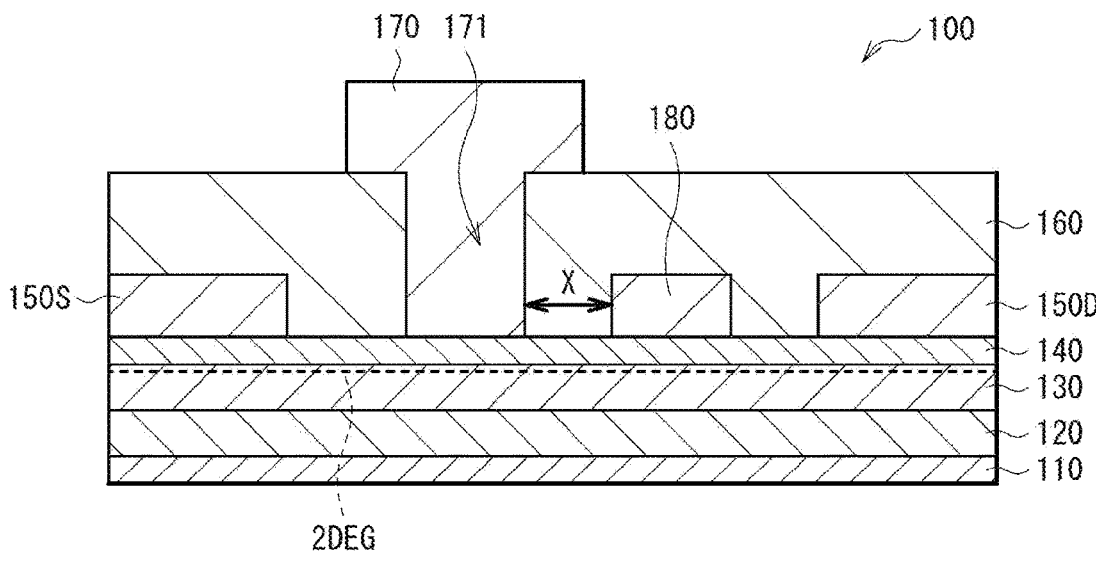
[FIG. 4]
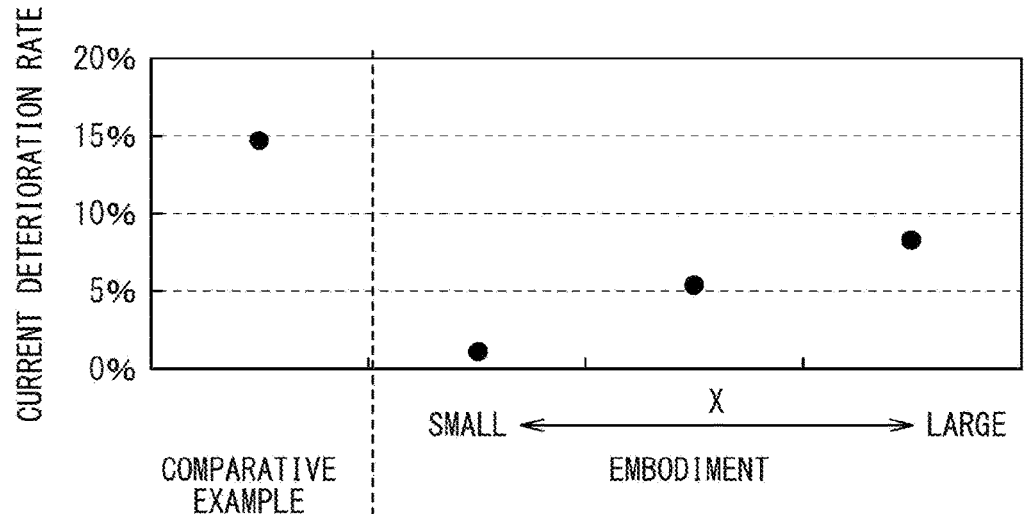

[FIG. 5]
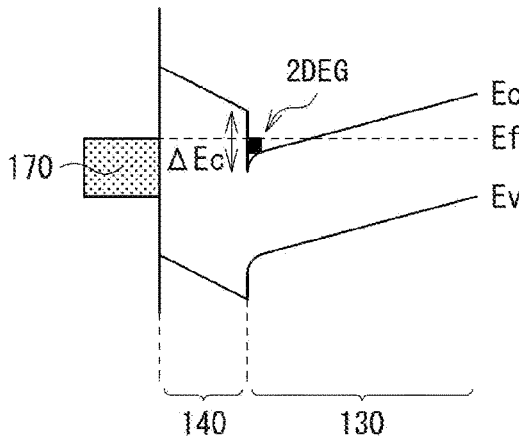
[FIG. 6]
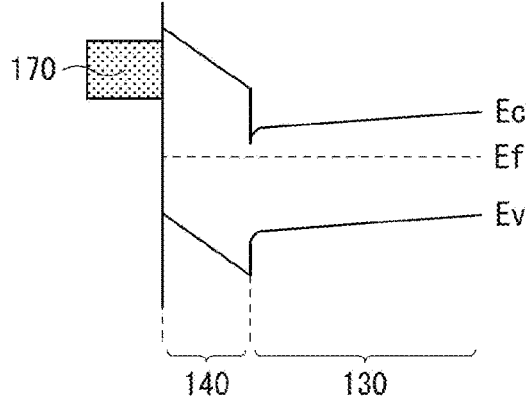
[FIG. 7]
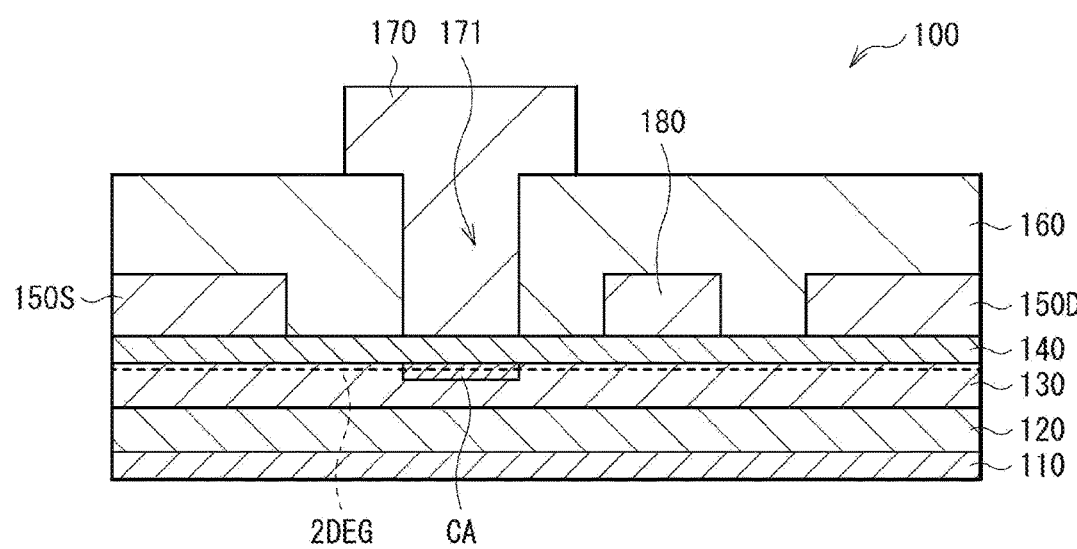

[FIG. 8]
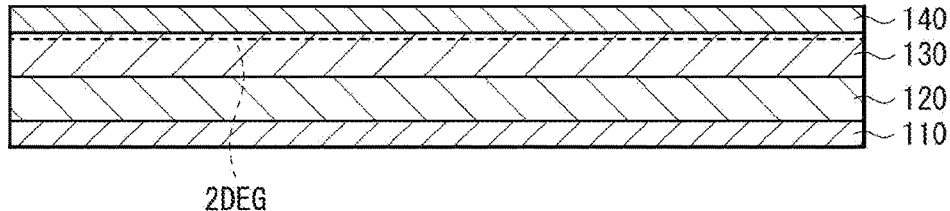
2DEG
[FIG. 9]
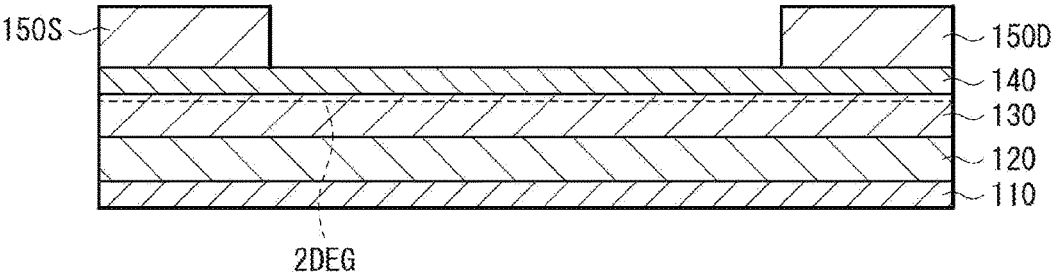
2DEG
[FIG. 10]
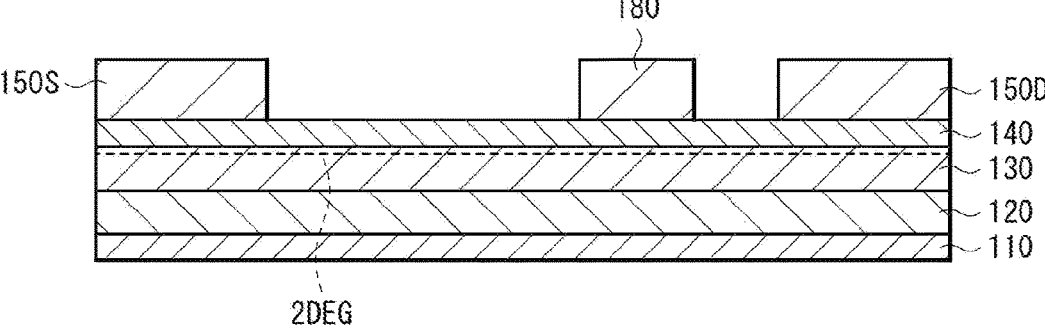
2DEG

[FIG. 11]
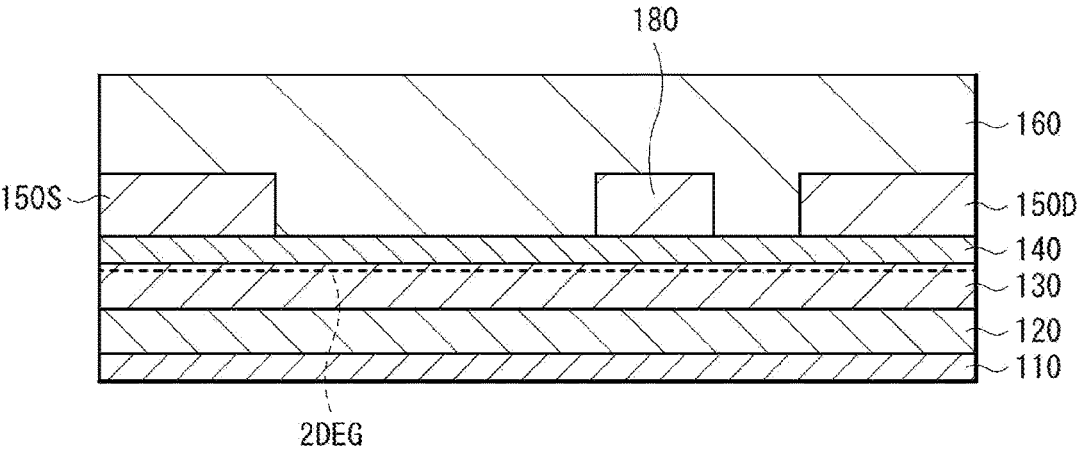
[FIG. 12]
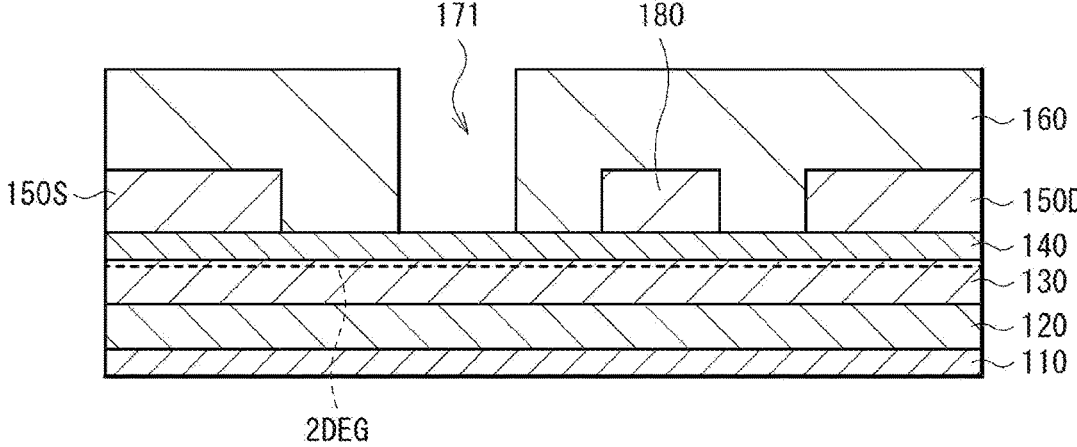

[FIG. 13]
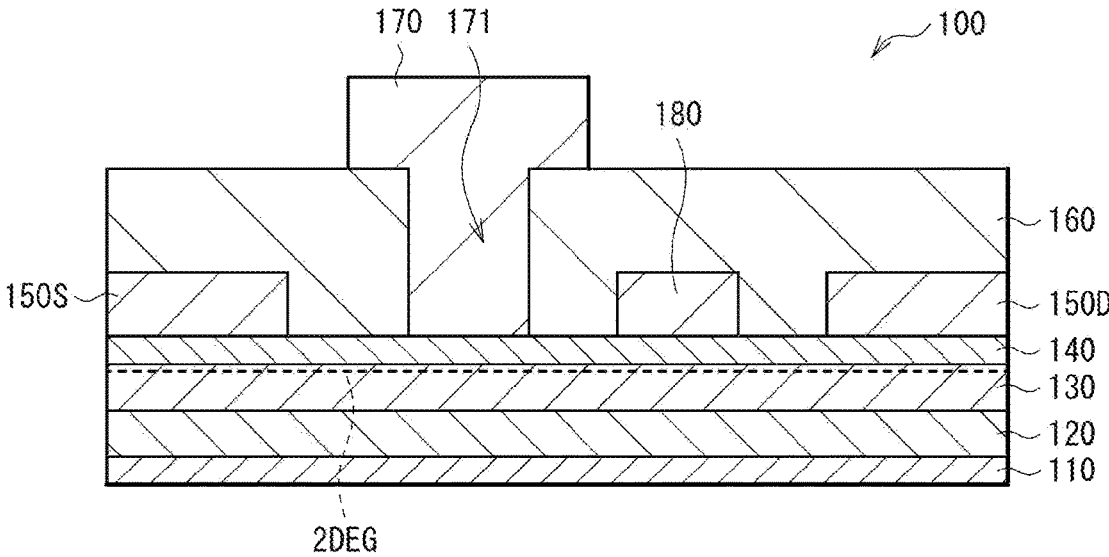
[FIG. 14]
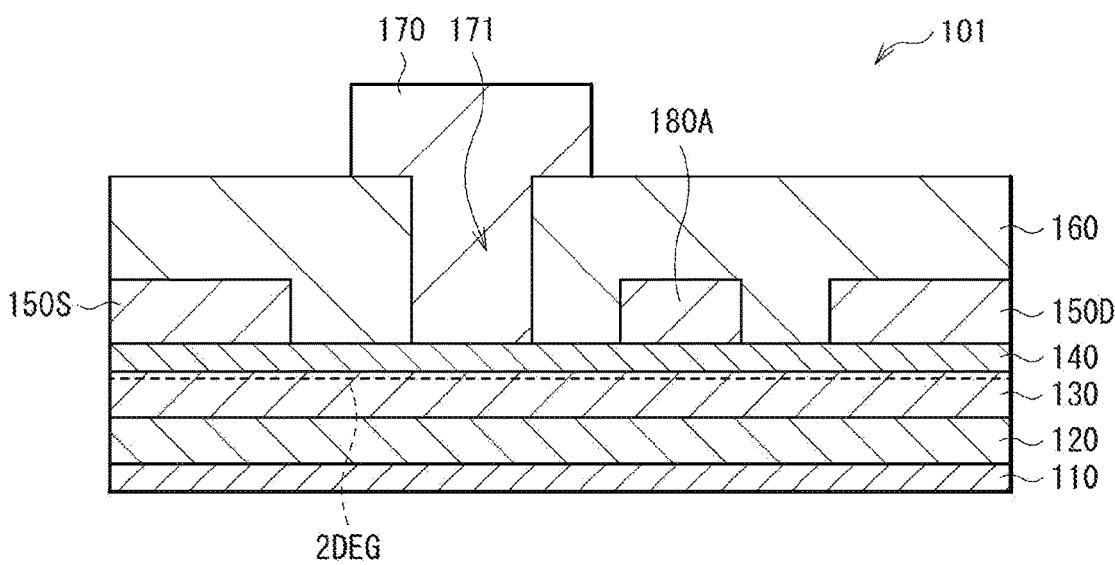

[FIG. 15]

[FIG. 16]
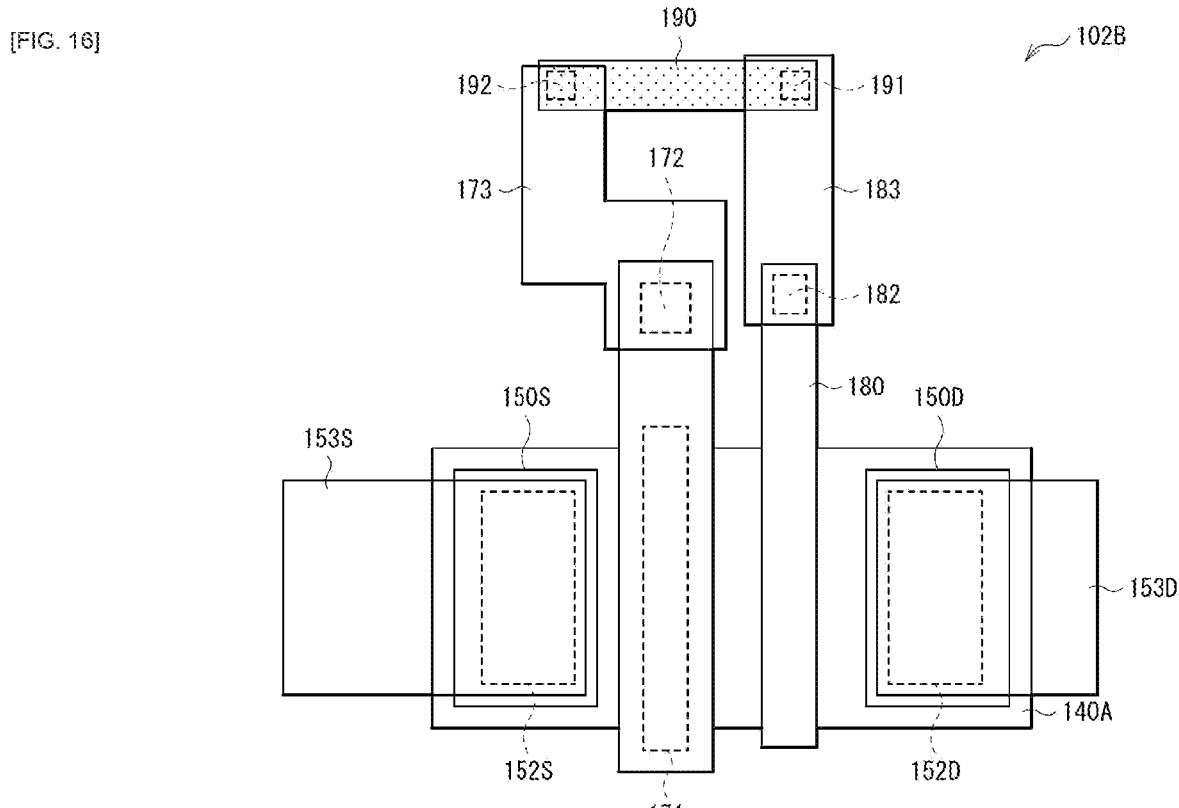

[FIG. 17]
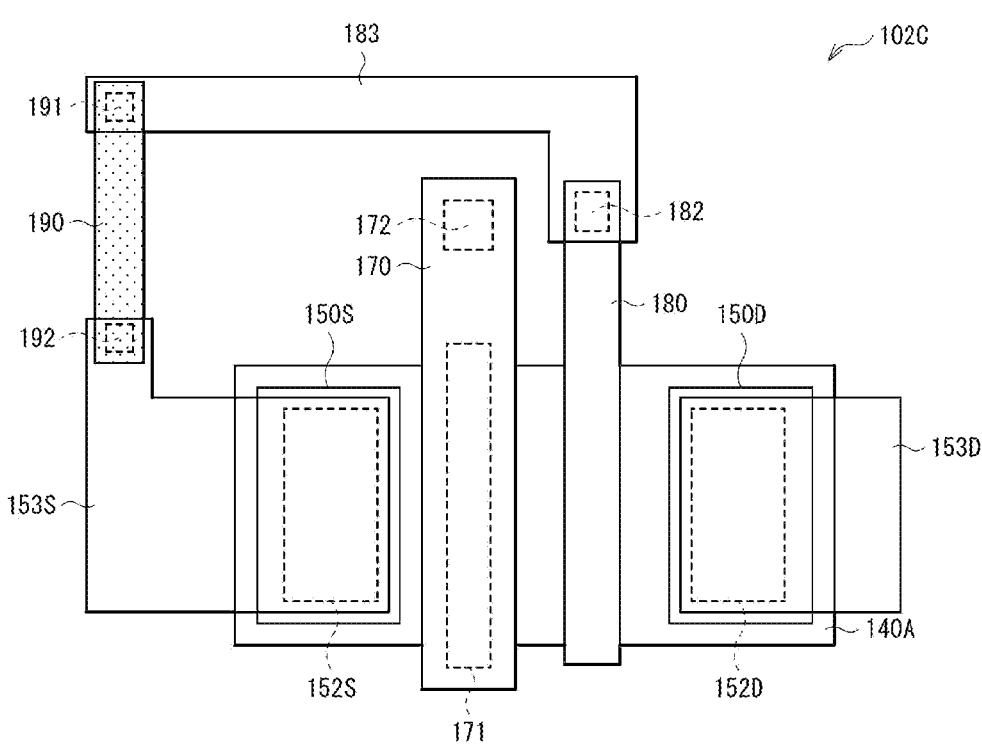

[FIG. 18]
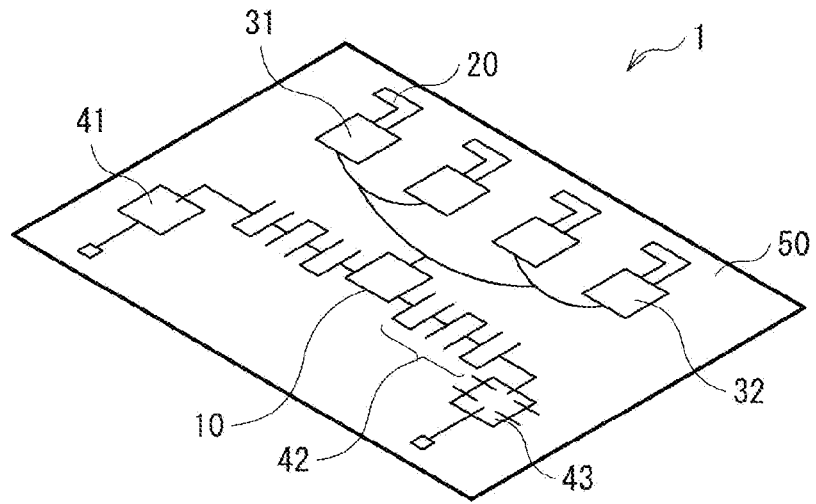
[FIG. 19]
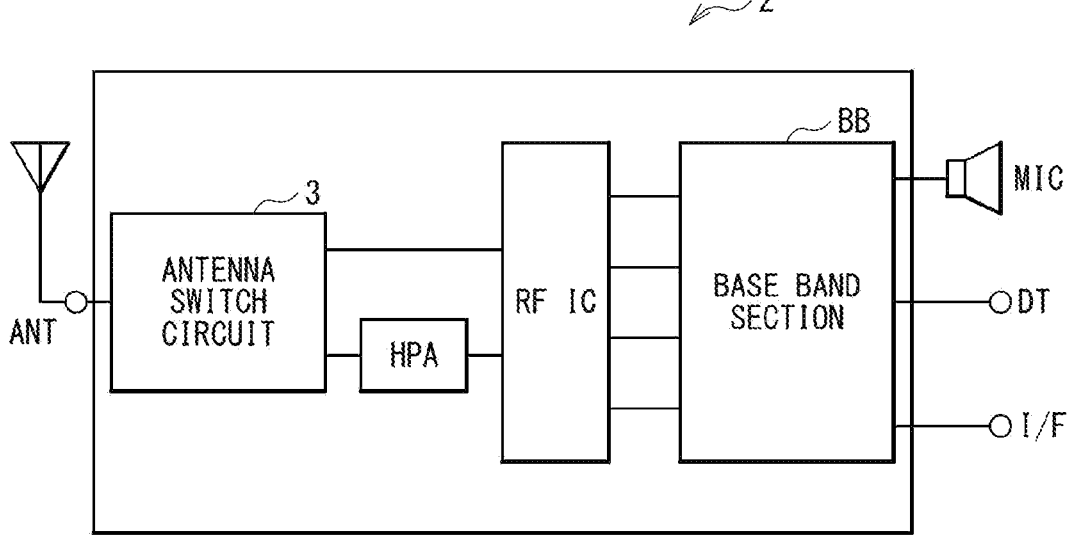

SEMICONDUCTOR UNIT, SEMICONDUCTOR MODULE, AND ELECTRONIC APPARATUS

CROSS REFERENCE TO RELATED APPLICATIONS

This application is a U.S. National Phase of International Patent Application No. PCT/JP2021/013868 filed on Mar. 31, 2021, which claims priority benefit of Japanese Patent Application No. JP 2020-090913 filed in the Japan Patent Office on May 25, 2020. Each of the above-referenced applications is hereby incorporated herein by reference in its entirety.

TECHNICAL FIELD

The present disclosure relates to a semiconductor unit, a semiconductor module, and an electronic apparatus.

BACKGROUND ART

Recently, a hetero field-effect transistor (Hetero Field Effect Transistor: HFET) having a channel of two-dimensional electron gas formed at an interface of a hetero junction of a compound semiconductor has been proposed (e.g., Patent Literature 1).

The two-dimensional electron gas has a high mobility of electrons and a high sheet electron density, so that the HFET in which the two-dimensional electron gas serves as the channel is expected to be a transistor that allows for a low resistance, a high withstand voltage, and a high-speed operation. For example, the HFET is expected to be applied to a power device, an RF (Radio Frequency) device, or the like.

CITATION LIST

Patent Literature

Patent Literature 1: Japanese Unexamined Patent Application Publication No. 2016-136547

SUMMARY OF THE INVENTION

However, in HFET using a compound semiconductor, a generation of an interface trap that traps electrons can occur at an interface between a compound semiconductor and an insulator. Because the interface trap has a possibility of causing a performance decrease of the HFET by a high voltage application, it is desired to suppress the generation of the interface trap in the HFET.

Therefore, it is desirable to provide a semiconductor unit, a semiconductor module, and an electronic apparatus in which a performance decrease by a high voltage application is suppressed.

A semiconductor unit according to one embodiment of the present disclosure includes: a barrier layer including a first compound semiconductor; a channel layer including a second compound semiconductor, and bonded to the barrier layer at a first face; an insulation layer provided on a second face, of the barrier layer, that is on an opposite side of the first face, and having an opening section that exposes the barrier layer; a gate electrode provided to bury the opening section; a source electrode and a drain electrode that are provided on the second face of the barrier layer on both sides of the gate electrode with the gate electrode being interposed; and a material layer including a metal material or a semiconductor material, and provided in contact with the second face of the barrier layer between the gate electrode and the drain electrode.

A semiconductor module according to one embodiment of the present disclosure includes a semiconductor unit. The semiconductor unit includes: a barrier layer including a first compound semiconductor; a channel layer including a second compound semiconductor, and bonded to the barrier layer at a first face; an insulation layer provided on a second face, of the barrier layer, that is on an opposite side of the first face, and having an opening section that exposes the barrier layer; a gate electrode provided to bury the opening section; a source electrode and a drain electrode that are provided on the second face of the barrier layer on both sides of the gate electrode with the gate electrode being interposed; and a material layer provided in contact with the second face of the barrier layer between the gate electrode and the drain electrode, and including a metal material or a semiconductor material.

An electronic apparatus according to one embodiment of the present disclosure includes a semiconductor unit. The semiconductor unit includes: a barrier layer including a first compound semiconductor; a channel layer including a second compound semiconductor, and bonded to the barrier layer at a first face; an insulation layer provided on a second face, of the barrier layer, that is on an opposite side of the first face, and having an opening section that exposes the barrier layer; a gate electrode provided to bury the opening section; a source electrode and a drain electrode that are provided on the second face of the barrier layer on both sides of the gate electrode with the gate electrode being interposed; and a material layer provided in contact with the second face of the barrier layer between the gate electrode and the drain electrode, and including a metal material or a semiconductor material.

According to the semiconductor unit, the semiconductor module, and the electronic apparatus of one embodiment of the present disclosure, the material layer that includes the metal material or the semiconductor material is provided between the gate electrode and the drain electrode on the barrier layer bonded to the channel layer. A density of an interface trap generated between the material layer and the barrier layer is lower than a density of an interface trap generated between the insulation layer and the barrier layer. Thus, for example, it is possible for the semiconductor unit to decrease the density of the interface trap between the gate electrode and the drain electrode.

BRIEF DESCRIPTION OF THE DRAWINGS

FIG. 1 is a vertical cross-sectional diagram illustrating a configuration of a semiconductor unit according to a first embodiment of the present disclosure.

FIG. 2 is a top diagram illustrating a configuration of the semiconductor unit according to the embodiment.

FIG. 3 is a vertical cross-sectional diagram illustrating a distance X between an opening section in which a gate electrode is embedded and a material layer.

FIG. 4 is a graph illustrating a change in a current deterioration rate with respect to the distance X illustrated in FIG. 3.

FIG. 5 is a graph illustrating a configuration of an energy band at a lower part of a gate electrode in which a gate voltage Vg is not applied.

FIG. 6 is a graph illustrating a configuration of an energy band at the lower part of the gate electrode in which the gate voltage Vg=−10 V is applied.

FIG. 7 is a vertical cross-sectional diagram illustrating a configuration of the semiconductor unit when the negative gate voltage Vg is applied.

FIG. 8 is a vertical cross-sectional diagram illustrating a step of a method of manufacturing the semiconductor unit according to the embodiment.

FIG. 9 is a vertical cross-sectional diagram illustrating a step of the method of manufacturing the semiconductor unit according to the embodiment.

FIG. 10 is a vertical cross-sectional diagram illustrating a step of the method of manufacturing the semiconductor unit according to the embodiment.

FIG. 11 is a vertical cross-sectional diagram illustrating a step of the method of manufacturing the semiconductor unit according to the embodiment.

FIG. 12 is a vertical cross-sectional diagram illustrating a step of the method of manufacturing the semiconductor unit according to the embodiment.

FIG. 13 is a vertical cross-sectional diagram illustrating a step of the method of manufacturing the semiconductor unit according to the embodiment.

FIG. 14 is a vertical cross-sectional diagram illustrating a step of the method of manufacturing the semiconductor unit according to the embodiment.

FIG. 15 is a top diagram illustrating an example of a configuration of a semiconductor unit according to a second modification example.

FIG. 16 is a top diagram illustrating another example of the configuration of the semiconductor unit according to the second modification example.

FIG. 17 is a top diagram illustrating further another example of the configuration of the semiconductor unit according to the second modification example.

FIG. 18 is a schematic perspective diagram illustrating a configuration of a semiconductor module according to a second embodiment of the present disclosure.

FIG. 19 is a block diagram illustrating a configuration of a wireless communication apparatus according to a third embodiment of the present disclosure.

MODES FOR CARRYING OUT THE INVENTION

Hereinafter, embodiments of the present disclosure will be described in detail with reference to the drawings. The embodiments described below are specific examples of the present disclosure, and a technique according to the present disclosure is not limited to the following embodiments. In addition, the arrangement, dimensions, dimensional ratios, and the like of the respective components of the present disclosure are not limited to the embodiments illustrated in the respective drawings.

It is to be noted that the description will be made in the following order.
1. First Embodiment
    1.1. Configuration Example
    1.2. Operation
    1.3. Manufacturing Method
    1.4. Modification Examples
2. Second Embodiment
3. Third Embodiment

1. First Embodiment

1.1. Configuration Example

Referring to FIGS. 1 and 2, a configuration example of a semiconductor unit according to a first embodiment of the present disclosure will be described. FIG. 1 is a vertical cross-sectional diagram illustrating a configuration of a semiconductor unit 100 according to the present embodiment. FIG. 2 is a top diagram illustrating a configuration of the semiconductor unit 100 according to the present embodiment.

As illustrated in FIGS. 1 and 2, the semiconductor unit 100 according to the present embodiment includes a substrate 110, a buffer layer 120, a channel layer 130, a barrier layer 140, a gate electrode 170, a source electrode 150S, a drain electrode 150D, an insulation layer 160, and a material layer 180. The semiconductor unit 100 is HFET in which a channel is two-dimensional electron gas 2DEG generated at a hetero junction interface of the channel layer 130 and the barrier layer 140 by a polarization of the channel layer 130 and the barrier layer 140.

It should be noted that, although not illustrated, the gate electrode 170, the source electrode 150S, and the drain electrode 150D each may be electrically coupled to a wiring line layer via a contact provided at an upper part of each electrode.

The substrate 110 is a substrate that includes a semiconductor material. Specifically, the substrate 110 may be a substrate configured by a group III-V compound semiconductor. For example, the substrate 110 may be a semi-insulating single-crystal GaN substrate having a lattice constant close to that of the later-described channel layer 130. It should be noted that, in a case where the semiconductor unit 100 includes the buffer layer 120, it is possible also for the substrate 110 to be a substrate that includes a material having a lattice constant different from that of the channel layer 130. In such a case, the substrate 110 may be, for example, a SiC substrate, a sapphire substrate, or a Si substrate.

The buffer layer 120 is a compound semiconductor layer epitaxially grown on the substrate 110. The buffer layer 120 is provided to mitigate a lattice-mismatch between the substrate 110 and the channel layer 130. By controlling a lattice constant of a face on which the channel layer 130 is provided, it is possible for the buffer layer 120 to make a crystalline state of the channel layer 130 better and to suppress a warpage of the substrate 110. For example, in a case where the substrate 110 is a single-crystal Si substrate and the channel layer 130 is a GaN layer, the buffer layer 120 may be a layer configured by AlN, AlGaN, or GaN.

The buffer layer 120 may be provided to have a mono-layer structure, or may be provided to have a multilayer structure in which a plurality of AlN, AlGaN, or GaN is stacked. In a case where the buffer layer 120 is configured by a ternary material, the buffer layer 120 may be so provided that its composition changes gradually in a thickness direction.

The channel layer 130 is a layer in which carriers are to be accumulated by the polarization with the barrier layer 140. For example, the channel layer 130 may be an epitaxially grown GaN layer. Further, the channel layer 130 may be an undoped u-GaN layer to which no impurity is added. In such a case, it is possible for the channel layer 130 to suppress an impurity scattering of the carriers and thereby to further increase the mobility of the carriers.

The barrier layer 140 is a layer that causes the carriers to be accumulated in the channel layer 130 by the polarization with the channel layer 130. For example, the barrier layer 140 may be an epitaxially grown $Al_{1-x-y}Ga_xIn_yN$ layer (where $0 \leq x < 1$, $0 \leq y < 1$). Further, the barrier layer 140 may be an undoped $u-Al_{1-x-y}Ga_xIn_yN$ layer to which no impurity is added. In such a case, it is possible for the barrier layer 140 to suppress the impurity scattering of the carriers in the channel layer 130 and thereby to further increase the mobility of the carriers.

It should be noted that the barrier layer 140 may be provided as a monolayer structure, or may be provided as a multilayer structure in which a plurality of Al1-x-yGaxInyN layers having different compositions is stacked. In addition, the barrier layer 140 may be so provided that its composition is gradually changed in a thickness direction.

Further, as illustrated in FIG. 2, an active region 140A and a device separation region 140B are provided in a laminate structure having the substrate 110, the buffer layer 120, the channel layer 130, and the barrier layer 140.

Specifically, the active region 140A is an island-shaped region in which the semiconductor unit 100 is provided. The active region 140A is provided with a source electrode 150S, a gate electrode 170, a material layer 180, and the drain electrode 150D that are arrayed in an extension direction of the active region 140A.

The device separation region 140B is a region inactivated by injecting B (boron) or the like into the channel layer 130 and the barrier layer 140. The device separation region 140B is so provided as to surround the active region 140A, making it possible for the device separation region 140B to electrically insulate each active region 140A. It should be noted that the device separation region 140B may be formed not by the injection of B (boron) but by removing the channel layer 130 and the barrier layer 140 by etching.

The insulation layer 160 is so provided on the barrier layer 140 as to cover the source electrode 150S, the drain electrode 150D, and the material layer 180. The insulation layer 160 may be, for example, provided by SiO2, SiN, SION, Al2O3, or the like having an insulating property with respect to the barrier layer 140. It is possible for the insulation layer 160 to protect a surface of the barrier layer 140 from an impurity such as ions.

The gate electrode 170 is so provided as to bury an opening section 171 provided on the insulation layer 160 from above the insulation layer 160. Specifically, the gate electrode 170 may be provided inside the opening section 171 that exposes the barrier layer 140 and at an upper part of the insulation layer 160, so as to have a T-shaped cross-sectional shape. The gate electrode 170 is in contact with the barrier layer 140 at a bottom part, and makes it possible to control the number of electrons in the channel layer 130 by an application voltage. For example, the gate electrode 170 may be provided to have a structure in which Ni and Au are stacked from the barrier layer 140 side.

It should be noted that a gate insulation film may be provided between the gate electrode 170 and the barrier layer 140. The gate insulation film may be provided, for example, as a monolayer film such as Al2O3, HfO2, or the like, or as a multilayer laminate film. It is possible for the gate insulation film to protect a surface of the barrier layer 140 from an impurity such as ions, and to suppress a decrease in characteristics of the semiconductor unit 100 by improving an interface with the barrier layer 140.

The source electrode 150S and the drain electrode 150D are provided in the active regions 140A on both sides of the gate electrode 170 with the gate electrode 170 being interposed therebetween. The source electrode 150S and the drain electrode 150D are so provided as to form a low resistance electrical connection with the two-dimensional electron gas 2DEG in the channel layer 130. For example, the source electrode 150S and the drain electrode 150D may be provided on the barrier layer 140, or may be so provided as to dig the barrier layer 140 (i.e., cause the barrier layer 140 to be recessed) to make them closer to the two-dimensional electron gas 2DEG. It should be noted that the source electrode 150S and the drain electrode 150D may be so provided as to be in contact with the two-dimensional electron gas 2DEG, or may be so provided as not to be in contact with the two-dimensional electron gas 2DEG. The source electrode 150S and the drain electrode 150D may be provided to have a structure in which, for example, Ti (titanium), Al (aluminum), Ni (nickel), and Au (gold) are sequentially stacked from the barrier layer 140 side.

Further, an N+ layer that contains an N-type impurity at a high concentration may be provided below the source electrode 150S and the drain electrode 150D. The N+ layer is provided to electrically couple the source and the drain electrodes 150S and 150D and the two-dimensional electron gas 2DEG at a lower resistance. The N+ layer may be so formed, for example, as to be dug up to a region that is deeper than a neighborhood region of the barrier layer 140 in the channel layer 130 that includes the two-dimensional electron gas 2DEG.

For example, the N+ layer may be provided by etching the barrier layer 140 and the channel layer 130, followed by selectively regrowing an n-In1-xGaxN layer to fill the etched region. In addition, the N+ layer may be formed by a selective ion injection of an N-type impurity into the barrier layer 140 and the channel layer 130. For example, the N+ layer may be so provided as to include Si or Ge as the N-type impurity at $1.0 \times 10^{18}$ cm$^{-3}$ or greater.

The material layer 180 includes a metal material or a semiconductor material, and is provided on the barrier layer 140 between the opening section 171 in which the gate electrode 170 is embedded and the drain electrode 150D. Specifically, the material layer 180 is so provided as to traverse the active region 140A in a direction orthogonal to the array direction of the gate electrode 170 and the drain electrode 150D. For example, the material layer 180 may be provided to include a metal material. More specifically, the material layer 180 may be provided to include a transition metal material, or may be provided to include Ti (titanium).

A density of an interface trap generated between the material layer 180 that includes the metal material or the semiconductor material and the barrier layer 140 becomes lower than a density of an interface trap generated between the insulation layer 160 and the barrier layer 140. This is because a dangling bond that is generated due to a difference in lattice constant between the insulation layer 160 and the barrier layer 140 and that causes the interface trap is less likely to occur between the material layer 180 and the barrier layer 140. Accordingly, because it is possible for the material layer 180 to decrease the density of the interface trap between the gate electrode 170 and the drain electrode 150D, it is possible to suppress a characteristic decrease (in particular, a reduction of a drain current) at the time of applying a high voltage (for example, 10 V or higher) in the semiconductor unit 100. Further, by providing the material layer 180 that includes the metal material or the semiconductor material in contact with the barrier layer 140, it is possible for the material layer 180 to allow electrons captured by the interface trap to be escaped from the barrier layer 140. Accordingly, it is possible for the material layer 180 to suppress characteristics of the semiconductor unit 100 from fluctuating during an operation.

The material layer 180 may be so provided as to have a potential different from that of the gate electrode 170. That is, the material layer 180 may be so provided as not to be electrically coupled to the gate electrode 170 by a wiring line or the like. For example, the material layer 180 may be provided in a floating state. With this configuration, it is possible for the material layer 180 to prevent a parasitic capacitance from being generated between the gate electrode 170 and the drain electrode 150D.

A plurality of material layers 180 may be provided on the barrier layer 140 between the opening section 171 in which the gate electrode 170 is embedded and the drain electrode 150D. Specifically, the plurality of material layers 180 may be so provided as to extend in parallel in a direction orthogonal to the array direction of the gate electrode 170 and the drain electrode 150D.

Further, the material layer 180 may be provided to have a laminate structure including a plurality of layers. Specifically, the material layer 180 may be provided to have a laminate structure including a first layer that includes a metal material and a second layer provided between the first layer and the barrier layer 140 and configured by an oxide in which the metal material included in the first layer is oxidized. For example, the material layer 180 may be provided to have a laminate structure including the first layer that includes Ti and the second layer that includes TiO in which Ti included in the first layer is oxidized on the barrier layer 140 side.

Now, referring to FIGS. 3 and 4, workings and effects of the semiconductor unit 100 according to the present embodiment described above will be described. FIG. 3 is a vertical cross-sectional diagram illustrating a distance X between the opening section 171 in which the gate electrode 170 is embedded and the material layer 180.

FIG. 4 is a graph illustrating a change in a current deterioration rate with respect to the distance X in the semiconductor unit 100. The current deterioration rate is a value in which a reduction rate of a drain current before and after the application of a high voltage of about 15 V to the drain electrode 150D is measured at a drain voltage Vd=1 V. FIG. 4 also illustrates, as a comparative example, a current deterioration rate of a semiconductor unit in which the material layer 180 is not provided.

In the semiconductor unit 100 according to the present embodiment, because it is possible to decrease the density of the interface trap generated at the barrier layer 140 by providing the material layer 180, it is possible to suppress a characteristic deterioration at the time of high voltage application and a characteristic variation during an operation. Specifically, as illustrated in FIG. 4, it can be appreciated that the current deterioration rate of the drain current before and after the application of a high-voltage stress to the drain electrode 150D is reduced in the semiconductor unit 100 according to the present embodiment as compared with the semiconductor unit according to the comparative example.

Further, it can be appreciated that the current deterioration rate becomes smaller as the distance X between the opening section 171 illustrated in FIG. 3 and the material layer 180 becomes shorter in the semiconductor unit 100 according to the present embodiment. This is considered to be because as the distance X between the opening section 171 and the material layer 180 becomes shorter, the area in which the interface trap in the vicinity of the gate electrode 170 is generated decreases. Because the interface trap in the vicinity of the gate electrode 170 greatly influences the characteristic deterioration at the time of high voltage application, it is considered that it is possible to expect a greater characteristic improvement effect by further decreasing the interface trap in the vicinity of the gate electrode 170.

Preferably, it is possible for the semiconductor unit 100 to make the current deterioration rate smaller as the distance X between the opening section 171 and the material layer 180 becomes shorter. However, from a viewpoint of manufacturing costs, a layout, and the like, it is preferable that the semiconductor unit 100 be provided such that the distance X between the opening section 171 and the material layer 180 is 0.2 μm or less, for example. In such a case, it is possible for the semiconductor unit 100 to reduce the current deterioration rate to a degree suitable for a power device or an RF device.

The semiconductor unit 100 according to the present embodiment having the above-described configuration may be used for, for example, a wireless communication apparatus in a mobile communication system or the like. Specifically, the semiconductor unit 100 according to the present embodiment may be suitably used for an RF switch or a power amplifier of a wireless communication apparatus or the like. More specifically, the semiconductor unit 100 according to the present embodiment may be suitably used for an RF switch or a power amplifier in a wireless communication apparatus in which a communication frequency is in an UHF (Ultra High Frequency) band or more.

1.2. Operation

Referring to FIGS. 5 to 7, an operation of the semiconductor unit 100 according to the present embodiment will be described. FIG. 5 is a graph illustrating a configuration of an energy band at a lower part of the gate electrode 170 in which a gate voltage Vg is not applied. FIG. 6 is a graph illustrating a configuration of an energy band at the lower part of the gate electrode 170 in which the gate voltage Vg=−10 V is applied. FIG. 7 is a vertical cross-sectional diagram illustrating a configuration of the semiconductor unit 100 when the negative gate voltage Vg is applied.

It should be noted that FIGS. 5 and 6 illustrate an example of a configuration of the energy band in a case where the channel layer 130 is configured by GaN and the barrier layer 140 is configured by an Al0.3-Ga0.7N mixed crystal. Further, Ec denotes an energy level at a lower end of a conduction band, Ev denotes an energy level at an upper end of a valence band, and Ef denotes the Fermi level.

As illustrated in FIG. 5, the semiconductor unit 100 is configured by bonding the channel layer 130 having a narrower band gap and the barrier layer 140 having a wider band gap than the channel layer 130. As a result, in the semiconductor unit 100, the carriers are accumulated at the channel layer 130 near the junction interface with the barrier layer 140 by the spontaneous polarization, the piezoelectric polarization, or both of the channel layer 130 and the barrier layer 140, and the two-dimensional electron gas 2DEG is formed. Further, a discontinuous quantity ΔEc at the lower end of the conduction band between the channel layer 130 and the barrier layer 140 is configured to be sufficiently large (e.g., 0.3 eV or more). With this configuration, it is possible for the semiconductor unit 100 to make the number of electrons distributed in the barrier layer 140 negligibly small with respect to the number of electrons distributed in the channel layer 130.

It should be noted that it is also possible to provide the barrier layer 140 on both sides of the channel layer 130. For example, a second barrier layer having a similar configuration to the barrier layer 140 may be provided on a face, of the channel layer 130, that is on the opposite side of a face on which the barrier layer 140 is provided (i.e., a face on the buffer layer 120 side). With this configuration, because it is possible for the semiconductor unit 100 to suppress the spread of electron distribution in the channel layer 130 toward the buffer layer 120 side, it is possible to improve characteristics such as suppressing a short channel effect.

Next, referring further to FIGS. 6 and 7, an operation of the semiconductor unit 100 according to the present embodiment will be described. The semiconductor unit 100 according to the present embodiment is, for example, a depletion type transistor in which a threshold voltage is about –5V.

As illustrated in FIGS. 6 and 7, it is possible for the semiconductor unit 100 to reduce the number of carriers in a carrier deficiency region CA at a lower part of the gate electrode 170 by applying the negative gate voltage Vg of, for example, about –10 V to the gate electrode 170. Thus, it is possible for the semiconductor unit 100 to reduce the number of electrons in the channel layer 130 and to prevent the drain current Id from flowing substantially. At this time, an energy band of the semiconductor unit 100 is as illustrated in FIG. 6, for example.

On the other hand, by applying the positive gate voltage Vg of, for example, about 1 V to the gate electrode 170, it is possible for the semiconductor unit 100 to eliminate the carrier deficiency region CA at the lower part of the gate electrode 170. Thus, it is possible for the semiconductor unit 100 to increase the number of electrons in the channel layer 130 and to modulate the drain current Id. At this time, an energy band of the semiconductor unit 100 is as illustrated in FIG. 5, for example.

In this way, it is possible for the semiconductor unit 100 according to the present embodiment to control a flow of the drain current Id by the application voltage Vg to the gate electrode 170.

1.3. Manufacturing Method

Referring to FIGS. 8 to 14, an example of a method of manufacturing the semiconductor unit 100 according to the present embodiment will be described. FIGS. 8 to 14 are vertical cross-sectional diagrams illustrating respective processes of the method of manufacturing the semiconductor unit 100 according to the present embodiment.

First, as illustrated in FIG. 8, the buffer layer 120 is formed by epitaxially growing AlN, AlGaN, or GaN on the substrate 110 configured by Si or the like, for example. Next, the channel layer 130 is formed by epitaxially growing GaN on the buffer layer 120. Subsequently, the barrier layer 140 is formed by epitaxially growing u-AlGaN (an Al0.3-Ga0.7N mixed crystal) on the channel layer 130.

Thereafter, although not illustrated, B (boron) is ion-injected into the barrier layer 140 and the channel layer 130 to increase the resistance of the barrier layer 140 and the channel layer 130, thereby forming the device separation region 140B. The device separation region 140B is so formed, for example, as to surround the periphery of the island-shaped active region 140A, and electrically isolates the active region 140A from each other. It should be noted that the formation of the device separation region 140B may be performed after the formation of the source electrode 150S and the drain electrode 150D which will be described later, or after the formation of the gate electrode 170.

Next, as illustrated in FIG. 9, the source electrode 150S and the drain electrode 150D are formed by patterning by lithography. Specifically, Ti (titanium), Al (aluminum), Ni (nickel), and Au (gold) are sequentially deposited, following which patterning is performed to form the source electrode 150S and the drain electrode 150D.

Subsequently, as illustrated in FIG. 10, the material layer 180 is formed by patterning by lithography. Specifically, a material that allows for a good interface state with the barrier layer 140 such as Ti (titanium) is deposited, following which patterning is performed to form the material layer 180.

Next, as illustrated in FIG. 11, the insulation layer 160 is formed by forming a film of SiO2 (silicon dioxide) or the like on the barrier layer 140 by a CVD (Chemical Vapor Deposition) method so as to cover the source electrode 150S, the drain electrode 150D, and the material layer 180. It should be noted that the insulation layer 160 may be provided by forming a film of an Al2O3 (an aluminum oxide) by an ALD (Atomic Vapor Deposition) method, or may be provided by forming a film of SiN (silicon nitride) by a CVD method. Further, the insulation layer 160 may be provided by stacking a plurality of layers formed by the material described above.

Subsequently, as illustrated in FIG. 12, the insulation layer 160 is etched to form the opening section 171 that exposes a surface of the barrier layer 140. Specifically, the opening section 171 is formed by etching away the insulation layer 160 of a corresponding region between the source electrode 150S and the material layer 180.

Thereafter, as illustrated in FIG. 13, the gate electrode 170 is formed to bury the opening section 171 and to extend over the insulation layer 160. Specifically, Ni (nickel) and Au (gold) are sequentially deposited, following which patterning is performed to form the gate electrode 170.

By the above processes, it is possible to form the semiconductor unit 100 according to the present embodiment.

1.4. Modification Examples

Figure 15:
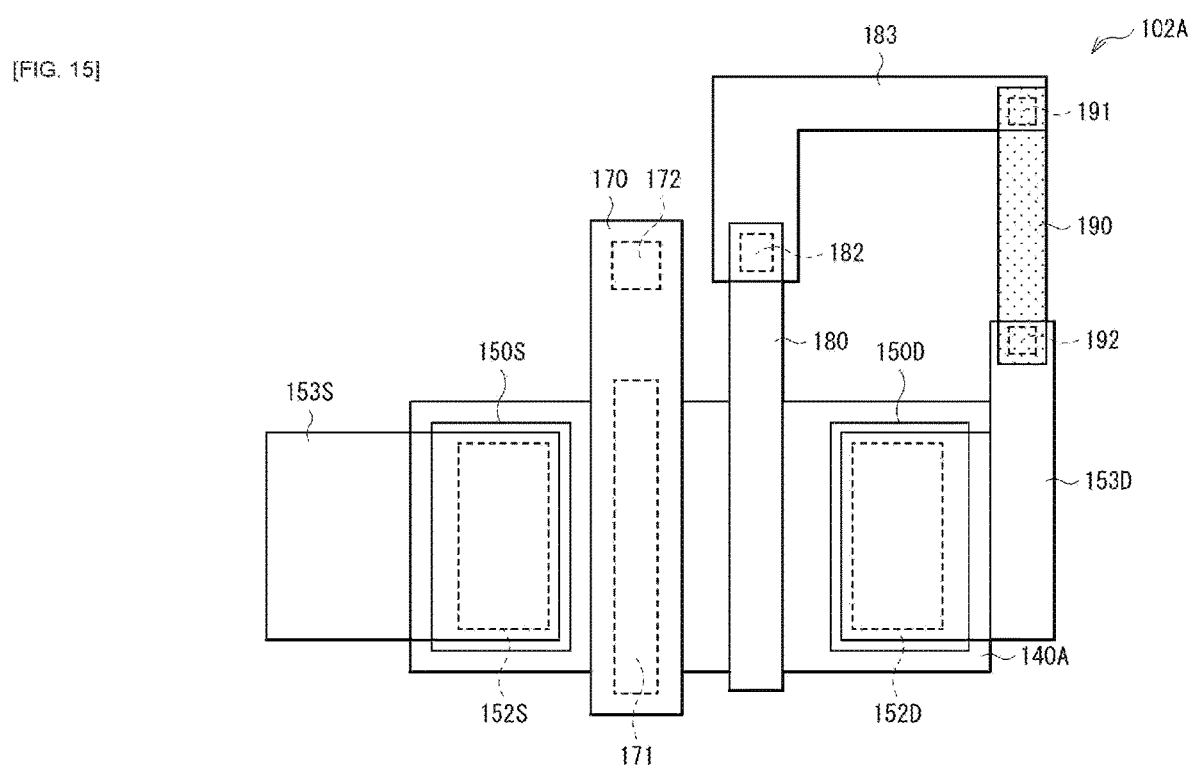

Referring to FIGS. 14 to 17, a first modification example and a second modification example of the semiconductor unit 100 according to the present embodiment will be described.

First Modification Example

First, referring to FIG. 14, a semiconductor unit according to the first modification example will be described. FIG. 14 is a vertical cross-sectional diagram illustrating a configuration of a semiconductor unit 101 according to the first modification example.

As illustrated in FIG. 14, the semiconductor unit 101 according to the first modification example differs from the semiconductor unit 100 illustrated in FIGS. 1 and 2 in that a material layer 180A includes the same material as the source electrode 150S and the drain electrode 150D.

Specifically, the material layer 180A may be provided to have the same metal material as the source electrode 150S and the drain electrode 150D. For example, in a case where the source electrode 150S and the drain electrode 150D are provided to have a structure in which Ti (titanium), Al (aluminum), Ni (nickel), and Au (gold) are sequentially stacked, the material layer 180A may be provided to have a structure in which Ti (titanium), Al (aluminum), Ni (nickel), and Au (gold) are sequentially stacked from the barrier layer 140 side. With this configuration, it is possible for the material layer 180A to be formed in the same process as the source electrode 150S and the drain electrode 150D.

Because it is possible for the semiconductor unit 101 according to the first modification example to allow the material layer 180A, the source electrode 150S, and the drain electrode 150D to be formed by the same process, it is possible to further reduce manufacturing costs. In addition, because it is possible for the semiconductor unit 101 according to the first modification example to reduce the number of patternings in the manufacturing process, it is possible to reduce the number of exposures of a surface of the semiconductor unit 101 to a resist or the like. Accordingly, it is possible for the semiconductor unit 101 to suppress the generation of a defect due to a foreign matter adherence or the like.

Second Modification Example

Next, referring to FIGS. 15 to 17, a semiconductor unit according to the second modification example will be described. FIG. 15 is a top diagram illustrating a configuration of a semiconductor unit 102A according to the second modification example. FIG. 16 is a top diagram illustrating a configuration of a semiconductor unit 102B according to the second modification example. FIG. 17 is a top diagram illustrating a configuration of a semiconductor unit 102C according to the second modification example.

As illustrated in FIGS. 15 to 17, the semiconductor units 102A, 102B, and 102C according to the second modification example differ from the semiconductor unit 100 illustrated in FIGS. 1 and 2, in that the material layer 180 is not in the floating state but is electrically coupled to one of the gate electrode 170, the source electrode 150S, or the drain electrode 150D via a resistance section 190.

Specifically, in FIGS. 15 to 17, a source wiring line 153S is electrically coupled to the source electrode 150S via a source contact via 152S, a drain wiring line 153D is electrically coupled to the drain electrode 150D via a drain contact via 152D, and the gate contact via 172 is electrically coupled to the gate electrode 170. The source electrode 150S, the drain electrode 150D, and the gate electrode 170 are electrically coupled to respective other devices or the like via respective contact vias and wiring lines. It should be noted that each contact via and wiring line may be formed by an electrically-conductive material such as a metal.

As illustrated in FIG. 15, the material layer 180 may be electrically coupled to the drain wiring line 153D through the contact via 182, the wiring line layer 183, the contact via 191, the resistance section 190, and the contact via 192. With this configuration, the material layer 180 has the same potential as the drain electrode 150D as a direct current (Direct Current). Accordingly, because it is possible for the semiconductor unit 102A to discharge electrons that have entered the material layer 180 to the drain electrode 150D, it is possible to further increase a stability of a device operation.

The resistance section 190 is, for example, a resistor of 1 MΩ or more. It is possible for the resistance section 190 to suppress high frequency characteristics of the semiconductor unit 102A from decreasing by suppressing an RF signal inputted to the gate electrode 170 from flowing to the drain electrode 150D via the material layer 180. That is, by electrically coupling the material layer 180 and the drain electrode 150D via the resistance section 190, it is possible for the semiconductor unit 102A to suppress the RF signal from propagating from the material layer 180 to the drain electrode 150D while causing the potential of the material layer 180 to be the same as the potential of the drain electrode 150D.

In addition, as illustrated in FIG. 16, the material layer 180 may be electrically coupled to the gate wiring line 173 through the contact via 182, the wiring line layer 183, the contact via 191, the resistance section 190, and the contact via 192. With this configuration, the material layer 180 has the same potential as the gate electrode 170 as a direct current (Direct Current). Accordingly, because it is possible for the semiconductor unit 102B to discharge electrons that has entered the material layer 180 to the gate electrode 170, it is possible to further increase the stability of the device operation.

The resistance section 190 is, for example, a resistor of 1 MΩ or more as with FIG. 15. It is possible for the resistance section 190 to suppress high frequency characteristics of the semiconductor unit 102B from decreasing by suppressing the RF signal inputted to the gate electrode 170 from directly flowing to the material layer 180. That is, by electrically coupling the material layer 180 and the gate electrode 170 via the resistance section 190, it is possible for the semiconductor unit 102B to suppress the RF signal from directly flowing to the material layer 180 while causing the potential of the material layer 180 to be the same as the potential of the gate electrode 170.

Further, as illustrated in FIG. 17, the material layer 180 may be electrically coupled to the source wiring line 153S through the contact via 182, the wiring line layer 183, the contact via 191, the resistance section 190, and the contact via 192. With this configuration, the material layer 180 has the same potential as the source electrode 150S as a direct current (Direct Current). Accordingly, because it is possible for the semiconductor unit 102C to discharge electrons that has entered the material layer 180 to the source electrode 150S, it is possible to further increase the stability of the device operation.

The resistance section 190 is, for example, a resistor of 1 MΩ or more as with FIG. 15. It is possible for the resistance section 190 to suppress high frequency characteristics of the semiconductor unit 102C from decreasing by suppressing the RF signal inputted to the gate electrode 170 from flowing to the source electrode 150S via the material layer 180. That is, by electrically coupling the material layer 180 and the source electrode 150S via the resistance section 190, it is possible for the semiconductor unit 102C to suppress the RF signal from propagating from the material layer 180 to the source electrode 150S while causing the potential of the material layer 180 to be the same as the potential of the source electrode 150S.

It should be noted that, although not illustrated, the material layer 180 may be electrically coupled to a ground line or a power line instead of the gate electrode 170, the source electrode 150S, or the drain electrode 150D. Even in such a case, because it is possible for the semiconductor unit 100 to discharge electrons that has entered the material layer 180 to the outside of the material layer 180, it is possible to further increase the stability of the device operation.

2. Second Embodiment

Next, referring to FIG. 18, a semiconductor module according to a second embodiment of the present disclosure will be described. FIG. 18 is a schematic perspective diagram illustrating a configuration of a semiconductor module 1 according to the present embodiment.

As illustrated in FIG. 18, the semiconductor module 1 according to the present embodiment is, for example, an antenna-integrated module in which an array-shaped edge antenna 20 and front-end components including a switch 10, a low noise amplifier 41, a bandpass filter 42, a power amplifier 43, and the like are mounted as a single module. The semiconductor module 1 may be used, for example, as a transceiver for communication.

The semiconductor module 1 includes, for example, the semiconductor unit 100 according to the first embodiment as a transistor configuring the switch 10, the low noise amplifier 41, the power amplifier 43, or the like. With this configuration, it is possible for the semiconductor module 1 to further increase a speed, increase an efficiency, and reduce the power consumption of a wireless communication.

3. Third Embodiment

Next, referring to FIG. 19, a wireless communication apparatus according to a third embodiment of the present disclosure will be described. FIG. 19 is a block diagram illustrating a configuration of a wireless communication apparatus 2 according to the present embodiment.

As illustrated in FIG. 19, the wireless communication apparatus 2 includes an antenna ANT, an antenna switch circuit 3, a high power amplifier HPA, a high frequency integrated circuit RFIC (Radio Frequency Integrated Circuit), a base band section BB, a sound output section MIC, a data output section DT, and an interface section I/F (e.g., a wireless LAN (Wireless Local Area Network: W-LAN), Bluetooth (registered trademark), or the like). The wireless communication apparatus 2 is, for example, a mobile telephone system having multiple functions including voice, data communications, LAN connection, and the like.

The wireless communication apparatus 2 includes the semiconductor unit 100 according to the first embodiment as a transistor configuring the antenna switch circuit 3, the high-power amplifier HPA, the high frequency integrated circuit RFIC, the base band section BB, or the like. With this configuration, it is possible for the wireless communication apparatus 2 to further increase a speed, increase an efficiency, and reduce the power consumption of a wireless communication. Accordingly, in a case where the wireless communication apparatus 2 is a portable communication terminal, because it is possible for the wireless communication apparatus 2 to further extend the usage time, it is possible to further improve portability.

A technique according to the present disclosure has been described above with reference to the first embodiment to the third embodiment and the modification examples. However, the technique according to the present disclosure is not limited to the above-described embodiments and the like, and various modifications can be made. The semiconductor unit 100 may be configured by a semiconductor other than a GaN-based semiconductor. For example, the semiconductor unit 100 may be configured by GaAs-based, InP-based, or SiGe-based compound semiconductor. In addition, the semiconductor unit 100 may be configured by silicon.

Further, not all of the configurations and operations described in the respective embodiments are essential to the configuration and the operation of the present disclosure. For example, among the elements in the respective embodiments, elements not recited in an independent claim based on the most generic concept of the present disclosure are to be understood as optional components.

The terms used throughout this specification and the appended claims should be construed as "non-limiting" terms. For example, the terms "including" or "included" should be construed as "not being limited to an embodiment in which it is described as including". The term "has" should be construed as "not being limited to an embodiment in which it is described as having".

The terms used in this specification are used merely for convenience of description and include terms that are not used for the purpose of limiting a configuration and an operation. For example, terms such as "right," "left," "up," and "down" merely indicate a direction in the drawing being referenced. In addition, the terms "inner" and "outer" merely indicate directions toward the center of an element of interest and away from the center of the element of interest, respectively. This applies similarly to terms similar to these terms and terms having the similar meanings.

The technique according to the present disclosure may be configured as follows. According to the technique of the present disclosure including the following configuration, it is possible for the semiconductor unit to decrease the density of the interface trap between the gate electrode and the drain electrode. Therefore, it is possible for the semiconductor unit to suppress a possibility of a performance decrease caused by a high voltage application. The effects of the technique according to the present disclosure are not necessarily limited to the effects described herein, and may be any of the effects described in the present disclosure.

(1)

A semiconductor unit including:

a barrier layer including a first compound semiconductor;

a channel layer including a second compound semiconductor, and bonded to the barrier layer at a first face;

an insulation layer provided on a second face, of the barrier layer, that is on an opposite side of the first face, and having an opening section that exposes the barrier layer;

a gate electrode provided to bury the opening section;

a source electrode and a drain electrode that are provided on the second face of the barrier layer on both sides of the gate electrode with the gate electrode being interposed; and a material layer including a metal material or a semiconductor material, and provided in contact with the second face of the barrier layer between the gate electrode and the drain electrode.

(2)

The semiconductor unit according to (1), in which the material layer includes the metal material.

(3)

The semiconductor unit according to (2), in which the material layer includes a transition metal material as the metal material.

(4)

The semiconductor unit according to (3), in which the material layer includes Ti as the transition metal material. (5)

The semiconductor unit according to any one of (1) to (4), in which the material layer is provided to be different in potential from the gate electrode. (6)

The semiconductor unit according to (5), in which the material layer is in a floating state.

(7)

The semiconductor unit according to (5), in which the material layer is electrically coupled to the source electrode or the drain electrode via a resistance section.

(8)

The semiconductor unit according to any one of (1) to (4), in which the material layer is electrically coupled to the gate electrode via a resistance section.

(9)

The semiconductor unit according to any one of (1) to (8), in which the material layer includes an electrically conductive material same as an electrically conductive material included in the source electrode or the drain electrode.

(10)

The semiconductor unit according to any one of (1) to (9), in which a distance between the material layer and the opening section is less than or equal to 0.2 μm.

(11)

The semiconductor unit according to any one of (1) to (10), in which the gate electrode, the source electrode, and the drain electrode are provided in an active region defined by a device separation region in the second face of the barrier layer, and the material layer extends to traverse the active region in a direction orthogonal to an array direction of the gate electrode and the drain electrode.

(12)

A semiconductor module including a semiconductor unit, the semiconductor unit including:

a barrier layer including a first compound semiconductor;

a channel layer including a second compound semiconductor, and bonded to the barrier layer at a first face;

an insulation layer provided on a second face, of the barrier layer, that is on an opposite side of the first face, and having an opening section that exposes the barrier layer;

a gate electrode provided to bury the opening section;

a source electrode and a drain electrode that are provided on the second face of the barrier layer on both sides of the gate electrode with the gate electrode being interposed; and a material layer provided in contact with the second face of the barrier layer between the gate electrode and the drain electrode, and including a metal material or a semiconductor material.

(13)

An electronic apparatus including a semiconductor unit, the semiconductor unit including:

a barrier layer including a first compound semiconductor;

a channel layer including a second compound semiconductor, and bonded to the barrier layer at a first face;

an insulation layer provided on a second face, of the barrier layer, that is on an opposite side of the first face, and having an opening section that exposes the barrier layer;

a gate electrode provided to bury the opening section;

a source electrode and a drain electrode that are provided on the second face of the barrier layer on both sides of the gate electrode with the gate electrode being interposed; and a material layer provided in contact with the second face of the barrier layer between the gate electrode and the drain electrode, and including a metal material or a semiconductor material.

The present application claims the benefit of Japanese Priority Patent Application JP2020-090913 filed with the Japan Patent Office on May 25, 2020, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A semiconductor unit, comprising:

a barrier layer that includes a first compound semiconductor;

a channel layer that includes a second compound semiconductor, wherein the channel layer is in contact with the barrier layer at a first face;

an insulation layer on a second face of the barrier layer, wherein the second face of the barrier layer is on an opposite side of the first face, and the insulation layer has an opening section that exposes the barrier layer;

a gate electrode in the opening section;

a source electrode and a drain electrode on the second face of the barrier layer wherein the gate electrode is between the source electrode and the drain electrode on the second face of the barrier layer; and a material layer including:

a metal material or a semiconductor material, and an electrically conductive material same as an electrically conductive material included in one of the source electrode or the drain electrode, wherein the material layer is in contact with the second face of the barrier layer between the gate electrode and the drain electrode.

2. The semiconductor unit according to claim 1, wherein the material layer includes the metal material.

3. The semiconductor unit according to claim 2, wherein the material layer includes a transition metal material as the metal material.

4. The semiconductor unit according to claim 3, wherein the material layer includes Ti as the transition metal material.

5. The semiconductor unit according to claim 1, wherein the material layer is different in potential from the gate electrode.

6. The semiconductor unit according to claim 5, wherein the material layer is in a floating state.

7. The semiconductor unit according to claim 5, wherein the material layer is electrically coupled to one of the source electrode or the drain electrode via a resistance section.

8. The semiconductor unit according to claim 1, wherein the material layer is electrically coupled to the gate electrode via a resistance section.

9. The semiconductor unit according to claim 1, wherein a distance between the material layer and the opening section is one of less than or equal to 0.2 pm.

10. The semiconductor unit according to claim 1, wherein the gate electrode, the source electrode, and the drain electrode are in an active region defined by a device separation region in the second face of the barrier layer, and the material layer extends to traverse the active region in a direction orthogonal to an array direction of the gate electrode and the drain electrode.

11. A semiconductor module, comprising:

a semiconductor unit that includes:

a barrier layer that includes a first compound semiconductor;

a channel layer that includes a second compound semiconductor, wherein the channel layer is in contact with the barrier layer at a first face;

an insulation layer on a second face of the barrier layer, wherein the second face of the barrier layer is on an opposite side of the first face, and the insulation layer has an opening section that exposes the barrier layer;

a gate electrode in the opening section;

a source electrode and a drain electrode on the second face of the barrier layer, wherein the gate electrode is between the source electrode and the drain electrode on the second face of the barrier layer; and a material layer that includes:

a metal material or a semiconductor material, and an electrically conductive material same as an electrically conductive material included in one of the source electrode or the drain electrode, wherein the material layer is in contact with the second face of the barrier layer between the gate electrode and the drain electrode.

12. An electronic apparatus, comprising:

a semiconductor unit that includes:

a barrier layer that includes a first compound semiconductor;

a channel layer that includes a second compound semiconductor, wherein the channel layer is in contact with to the barrier layer at a first face;

an insulation layer provided on a second face of the barrier layer, wherein the second face of the barrier layer is on an opposite side of the first face, and the insulation layer has an opening section that exposes the barrier layer;

a gate electrode in the opening section;

a source electrode and a drain electrode on the second face of the barrier layer, wherein the gate electrode is between the source electrode and the drain electrode on the second face of the barrier layer; and a material layer that includes:

a metal material or a semiconductor material, and an electrically conductive material same as an electrically conductive material included in one of the source electrode or the drain electrode, wherein the material layer is in contact with the second face of the barrier layer between the gate electrode and the drain electrode.

* * * * *